US006822731B1

(12) United States Patent
Laganza et al.

(10) Patent No.: US 6,822,731 B1
(45) Date of Patent: Nov. 23, 2004

(54) METHOD AND APPARATUS FOR A PELLICLE FRAME WITH HEIGHTENED BONDING SURFACES

(75) Inventors: Joseph Laganza, Norwalk, CT (US); Jorge Ivaldi, Trumbull, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 10/464,840

(22) Filed: Jun. 18, 2003

(51) Int. Cl.[7] ................ G03B 27/62; G03B 27/42; G03B 27/58

(52) U.S. Cl. .............. 355/75; 355/53; 355/72

(58) Field of Search ............... 355/53, 72–76; 310/310, 12; 318/649; 378/34, 35; 430/5, 20, 30

(56) References Cited

U.S. PATENT DOCUMENTS

| | | | |
|---|---|---|---|
| 4,719,705 A | | 1/1988 | Laganza et al. .............. 33/568 |
| 4,986,007 A | | 1/1991 | Laganza et al. .............. 33/621 |
| 5,487,771 A | | 1/1996 | Zeller ........................... 55/523 |
| 5,691,088 A | * | 11/1997 | Kubota et al. .................. 430/5 |
| 5,727,685 A | | 3/1998 | Laganza et al. ............ 206/455 |
| 5,814,381 A | | 9/1998 | Kuo ............................. 428/14 |
| 6,101,237 A | * | 8/2000 | Miyachi et al. ............... 378/35 |
| 6,192,100 B1 | * | 2/2001 | Acosta et al. .................. 378/35 |
| 6,216,873 B1 | | 4/2001 | Fosnight et al. ............ 206/710 |
| 6,507,390 B1 | * | 1/2003 | Ivaldi ........................... 355/75 |
| 2002/0085183 A1 | | 7/2002 | Wu et al. ....................... 355/30 |
| 2002/0179522 A1 | | 12/2002 | Phillips et al. .............. 210/510 |

FOREIGN PATENT DOCUMENTS

| EP | 0 696 760 A1 | 2/1996 | ............ G03F/1/14 |
|---|---|---|---|

OTHER PUBLICATIONS

*Thomas Register, Companies Found, Search Path: porous: Metals; Porous: 38 companies found* (visited Dec. 27, 1999) http://www.5.thomasregister.com, 2 pages.
*Filter Technology: Functional porosity for high–performance applications* (visited Dec. 27, 1999) http://www.gknsintermetals.com/filter_technology.html, 2 pages.
Patent Abstracts of Japan, vol. 011, JP 09 197652A, published Jul. 31, 1997.
Patent Abstracts of Japan, vol. 015, No. 410 (P–1264), JP 03 166545A, published Jul. 18, 1991.
Patent Abstracts of Japan, vol. 016, No. 521 (E–1285), JP 04 196117A, published Jul. 15, 1992.
Patent Abstracts of Japan, vol. 017, No. 060 (P–1482), JP 04 269752A, published Sep. 25, 1992.
Patent Abstracts of Japan, vol. 018, No. 096 (p–1694), JP 05 297572 A, published Nov. 12, 1993.
Copy of International Search Report issued Mar. 19, 2001 for PCT/US00/30432, 7 pages.
Patent Abstracts of Japan, JP 04 196117, published Jul. 15, 1992.

* cited by examiner

*Primary Examiner*—Henry Hung Nguyen
(74) *Attorney, Agent, or Firm*—Sterne, Kessler, Goldstein & Fox, PLLC

(57) ABSTRACT

A method and apparatus for maintaining an optical gap between optical structures in a photolithography system is described. A frame defines first and second opposing surfaces. The first opposing surface defines a first opening and the second opposing surface defines a second opening. A plurality of spacing members are spaced apart on the first opposing surface around the first opening. The spacing members have substantially co-planar surfaces configured to mate with a surface of a first optical structure. A bonding agent seals a space around the first opening between the first opposing surface and the first optical structure. The frame thereby encloses the optical gap between the first optical structure and a second optical structure.

30 Claims, 15 Drawing Sheets

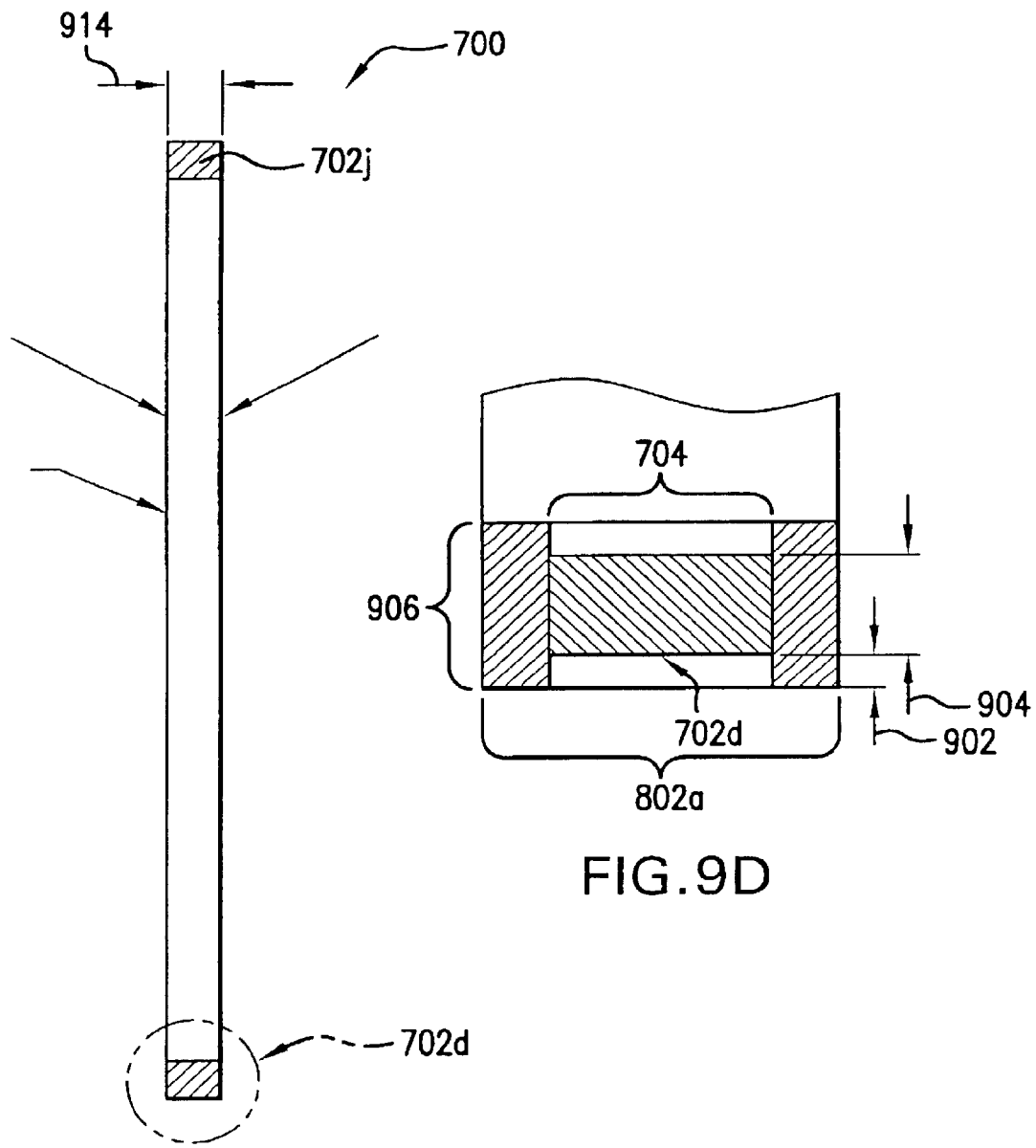

METHOD AND APPARATUS FOR A PELLICLE FRAME WITH HEIGHTENED BONDING SURFACES

BACKGROUND OF THE INVENTION

1. Field of the Invention

The present invention is generally related to photolithography systems, and more particularly, to pellicle and reticle frames in a photolithography system.

2. Background Art

In the fabrication of integrated circuits, photolithographic and projection printing techniques are used. In photolithography, an image contained on a reticle is projected onto a wafer having a photosensitive resist thereon. The reticle or mask is used to transfer a desired image onto the silicon wafer. The semiconductor wafer surface is coated with photosensitive resist so that an image is etched thereon. A pellicle may be used in combination with the reticle to protect the reticle surface from damage. The pellicle is traditionally mounted on a solid frame to the reticle.

Some wavelengths of light used in photolithography are sensitive to absorption by atmospheric oxygen. Hence, when such oxygen-sensitive light wavelengths are used in photolithography, they must be transmitted through an oxygen-purged atmosphere.

A photolithography system is typically located in a clean room environment. In some situations, the ambient atmosphere of the clean room cannot be purged of oxygen because this may cause other problems with the photolithography process. For instance, a laser interferometer used in a lithography system may be sensitive to changes in the index of refraction of the air, which may occur with a change to an oxygen-free atmosphere. Hence, the oxygen-free environment may have to be restricted to less than the entire lithography system. What is needed is a transmission medium for light wavelengths that have high absorption in an oxygen-containing environment.

A pellicle is generally mounted on a frame opposite a corresponding reticle. Hence, an air gap may exist between the reticle and pellicle. What is needed is a transmission medium through the reticle-to-pellicle air gap for light wavelengths that have high absorption in an oxygen-containing environment.

Furthermore, the pellicle and/or reticle can become distorted when attached to the frame, adversely affecting the photolithography process. Thus, what is needed is a way of reducing or eliminating distortion in the pellicle and/or reticle when attached to the frame.

BRIEF SUMMARY OF THE INVENTION

The present invention is directed to a method and apparatus for a reticle with a purged pellicle-to-reticle gap. The present invention maintains a substantially oxygen-free, purge gas environment in a pellicle-to-reticle gap. The purge gas environment provides a transmission medium for light wavelengths that have high absorption in a non-purged environment.

In a preferred embodiment, the present invention is applied to a photolithography system. A porous frame between a reticle and a pellicle creates a gap or space between the reticle and pellicle. The porous frame may passively filter ambient air entering the gap through the porous frame to create a substantially particle-free gap. The particulate protection is required to ensure that particles do not deposit on the critical reticle surface, degrading the reticle image projected onto a semiconductor wafer surface. This includes protection during storage of the reticle and usage of the reticle in a lithographic process.

The passive or static porous frame acts to normalize the pressure within the reticle to pellicle gap with the external ambient air atmosphere. This normalization action effectively reduces or eliminates distortion of either the reticle and/or pellicle due to atmospheric pressure.

The porous frame includes a first opposing surface with a first opening. The first opposing surface is configured to mate with the pellicle. The porous frame includes a second opposing surface with a second opening. The second opposing surface is configured to mate with the reticle to enclose the optical gap between the pellicle and the reticle.

A purged reticle to pellicle gap may be formed by filling the gap with a purge gas that does not contain oxygen. The purge gas in the gap may be maintained dynamically by continuously infusing the purge gas.

A dynamic porous frame may be coupled to a purge gas supply. The purge gas supply inserts a purge gas into the gap between the reticle and pellicle through the porous frame, establishing a purge gas flow in the gap within the porous frame.

A vacuum source may be coupled to the dynamic porous frame to remove gas from the reticle-to-pellicle gap environment through the porous frame, further providing continuous gas flow in the reticle.

The purge gas flow in the gap of a dynamic porous frame may be balanced with an external atmospheric pressure to reduce or eliminate reticle or pellicle distortions.

The porous frame of the present invention is applicable to other environments, including other optical environments. In an example alternative optical embodiment, the porous frame can provide a purged optical path between any optical source surface and any optical target surface. The optical source surface and optical target surface may be any suitable optical surfaces known to persons skilled in the relevant art(s).

In another aspect of the present invention, a frame defines first and second opposing surfaces. The first opposing surface defines a first opening, and is configured to mate with the pellicle. The second opposing surface defines a second opening, and is configured to mate with the reticle to enclose the optical gap between the pellicle and the reticle. At least one edge of the frame has an opening therethrough. A porous sintered material fills each opening through an edge of the frame.

In still another aspect of the present invention, an optical gap between optical structures in a photolithography system is maintained. A frame defines first and second opposing surfaces. The first opposing surface defines a first opening and the second opposing surface defines a second opening. A plurality of spacing members are spaced apart on the first opposing surface around the first opening. The spacing members have substantially co-planar surfaces configured to mate with a surface of a first optical structure. A bonding agent seals a space around the first opening between the first opposing surface and the first optical structure. The frame thereby encloses the optical gap between the first optical structure and a second optical structure.

In one aspect of the present invention, the plurality of spacing members are formed integrally with the frame. In another aspect of the present invention, the plurality of spacing members are formed separately from the frame.

In a further aspect of the present invention, a second plurality of spacing members are spaced apart on the second opposing surface around the second opening. The second plurality of spacing members have substantially co-planar surfaces configured to mate with a surface of the second optical structure. The bonding agent seals a space around the second opening between the second opposing surface and the second optical structure.

In a further aspect of the present invention, one of the first and second optical structures is a reticle, and the other is a pellicle. The reticle and pellicle are in optical alignment.

In yet another aspect of the present invention, an optical gap is maintained between optical structures in a photolithography system. A frame defines first and second opposing surfaces. The first opposing surface defines a first opening and the second opposing surface defines a second opening. A bonding agent seals a space around the first opening between the first opposing surface and a first optical structure. The bonding agent including a spacer material that maintains the first optical structure at a substantially uniform distance from the first opposing surface. The frame thereby encloses the optical gap between the first optical structure and a second optical structure.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

In the drawings, like reference numbers generally indicate identical, functionally similar, and/or structurally similar elements. The drawing in which an element first appears is indicated by the left-most digit(s) in the corresponding reference number.

FIGS. 8A-8D each show an example frame having one or more porous material inserts positioned therein, according to example embodiments of the present invention.

FIGS. 9A-9D show various views of another example frame with porous material inserts, according to an embodiment of the present invention.

Figure 10:
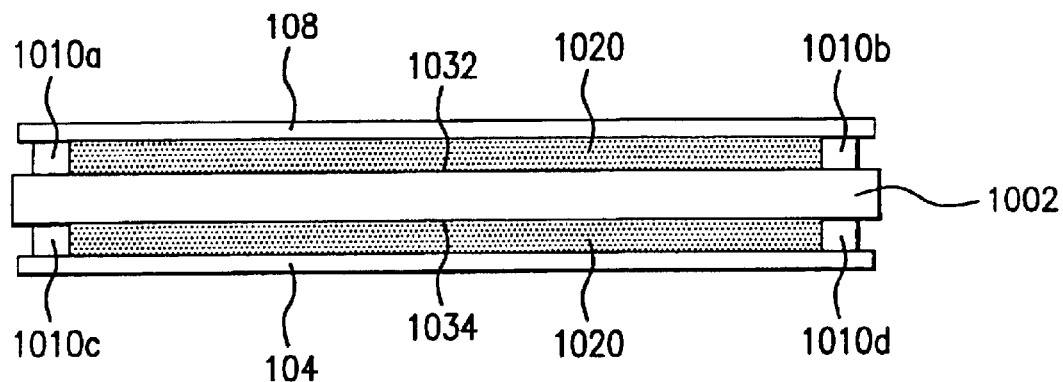
Figure 11:
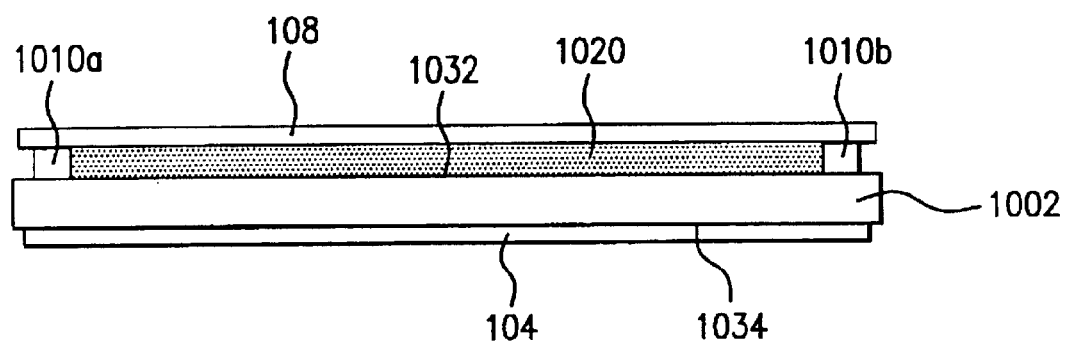

FIGS. 10 and 11 show side views of frames having optical structures attached thereto via spacing structures, according to example embodiments of the present invention.

Figure 12:
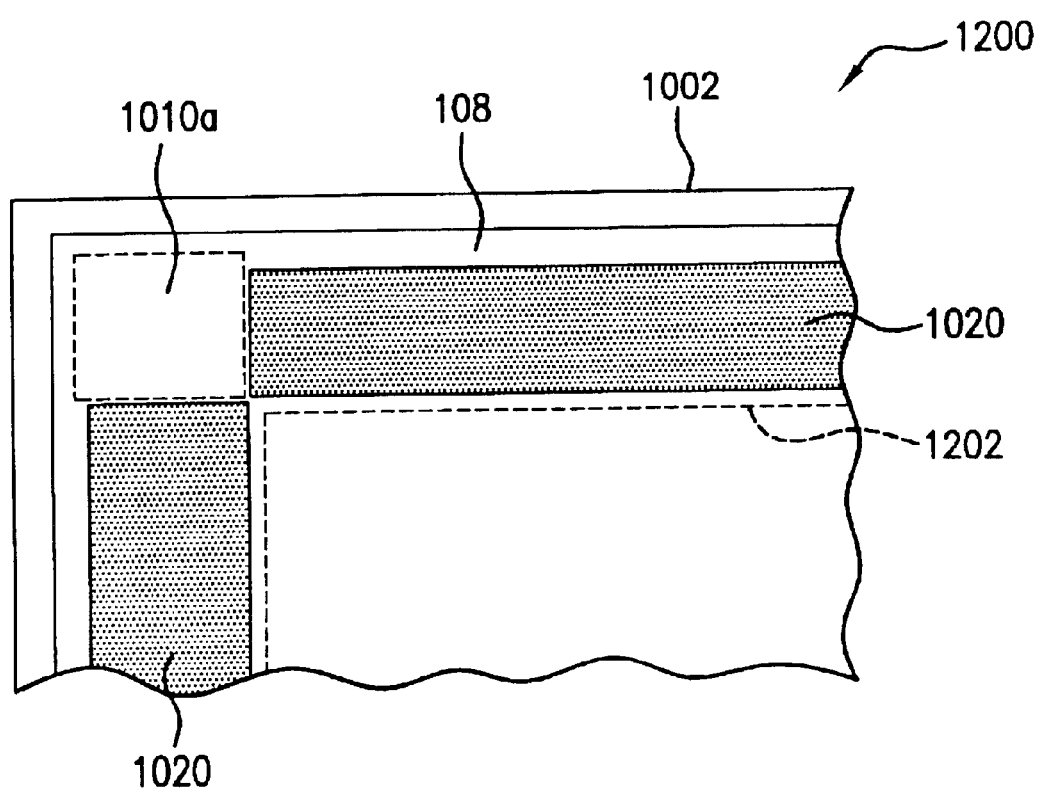

FIG. 12 shows a top view of a portion of a frame having an optical structure attached via spacing structures, according to an example embodiment of the present invention.

FIGS. 13-16 show frames with example spacing member arrangements, according to embodiments of the present invention.

Figure 17:
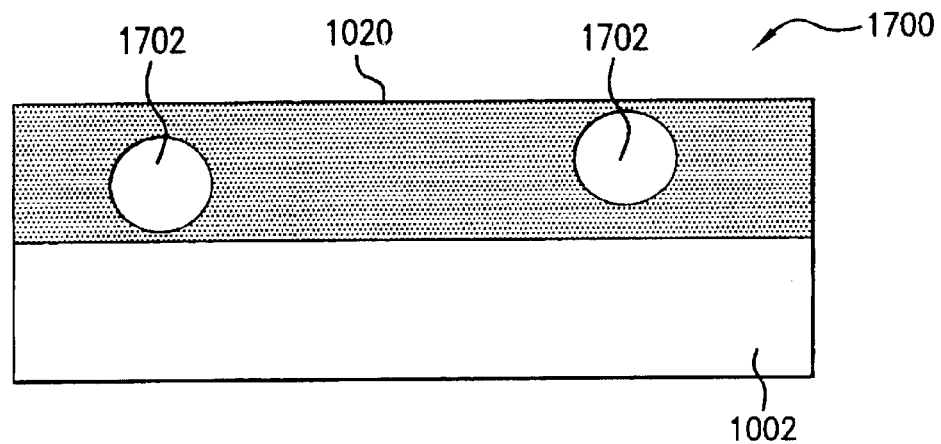

FIG. 17 shows a frame with a bonding material comprising a spacer material applied thereto, according to an example embodiment of the present invention.

Figure 18:
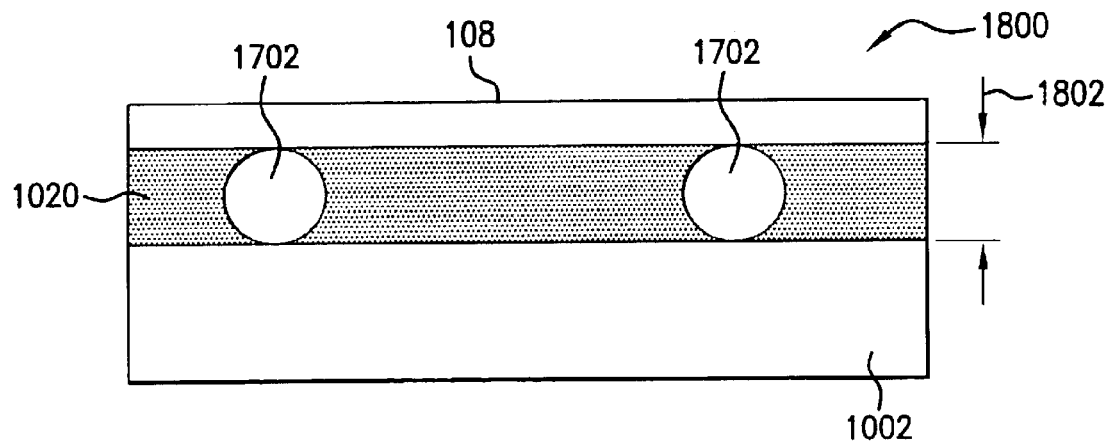

FIG. 18 shows the frame of FIG. 17, with an optical structure held by the bonding material at a substantially uniform distance from the frame, according to an example embodiment of the present invention.

Figure 19:
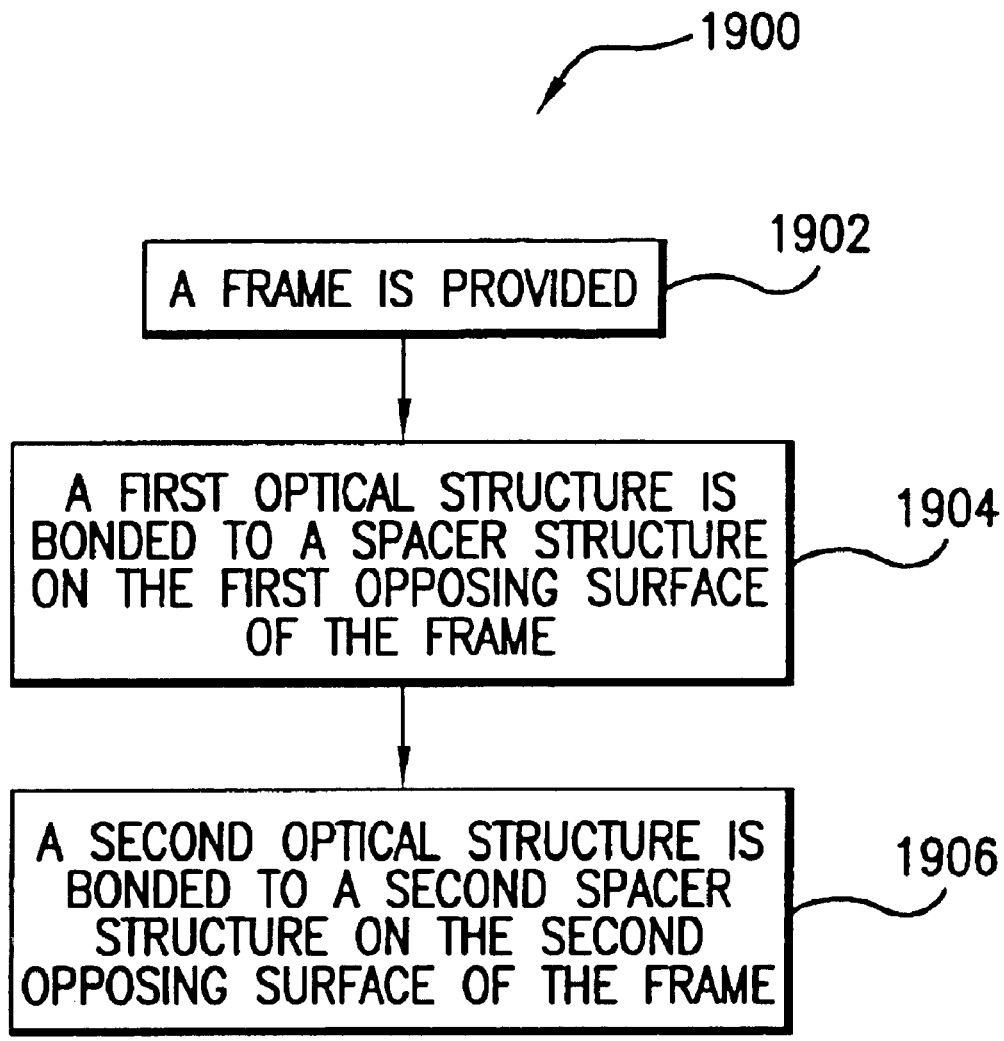

FIG. 19 illustrates a flowchart providing steps for forming an optical gap in a frame, according to an example embodiment of the present invention.

The present invention will now be described with reference to the accompanying drawings. In the drawings alike reference numbers indicate identical or functionally similar elements. Additionally, the last most digits of a reference number identifies the drawing in which the reference number first appears.

DETAILED DESCRIPTION OF THE INVENTION

To more clearly delineate the present invention, an effort is made throughout the specification to adhere to the following term definitions as consistently as possible.

"Ambient air" means an oxygen-containing atmosphere, such as normal atmospheric air. For instance, "ambient air" may mean air in an oxygen-containing clean room atmosphere or environment.

"Purge gas" means a gas that does not contain oxygen, or some other undesired gas, and is used to fill a purged air gap or space.

Figure 1:
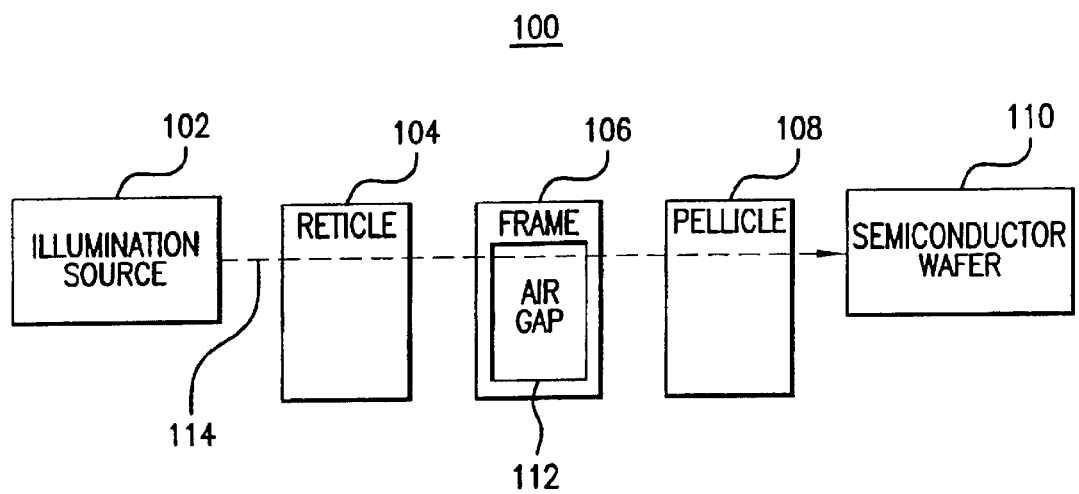
FIG. 1 illustrates a block diagram of the relevant portion of the optical path of a conventional lithography system.

FIG. 1 illustrates a relevant portion of a conventional photolithography system 100. Conventional photolithography system 100 is located in an ambient air or gas environment. Some portions of a conventional photolithography system may not be shown in FIG. 1 for purposes of brevity, such as source optics, projection optics, etc.

Conventional photolithography system 100 comprises an illumination source 102, a reticle 104, a frame 106, a pellicle 108, and a semiconductor wafer 110.

Illumination source 102 includes a source of radiation for exposing a surface of semiconductor wafer 110 with a pattern on reticle 104.

Reticle 104 includes a mask with a pattern that is transferred to a surface of semiconductor wafer 110 by radiation from illumination source 102.

Frame 106 is a conventional solid frame to which the reticle and pellicle are attached. Frame 106 comprises an air gap 112. Air gap 112 is formed within frame 106 between reticle 104 and pellicle 108.

Pellicle 108 is a is a clear cover for protecting reticle 104 from particulate damage.

Semiconductor wafer 110 is a semiconductor wafer with a surface to be exposed and etched by radiation from illumination source 102 with a pattern from reticle 104.

Illumination source 102 produces radiation 114. Radiation 114 is transmitted through reticle 104, frame 106, air gap 112, and pellicle 108, to a surface of semiconductor wafer 110. When radiation 114 includes light wavelengths that are absorbed by oxygen, oxygen in air gap 112 may absorb at least a portion of these wavelengths, potentially preventing a sufficient amount of radiation 114 from reaching the surface of semiconductor wafer 110. This absorption may lead to an inadequate amount of radiation transferring the pattern of reticle 104 to the surface of semiconductor wafer 110, leading to reduced semiconductor wafer yields.

Figure 2:
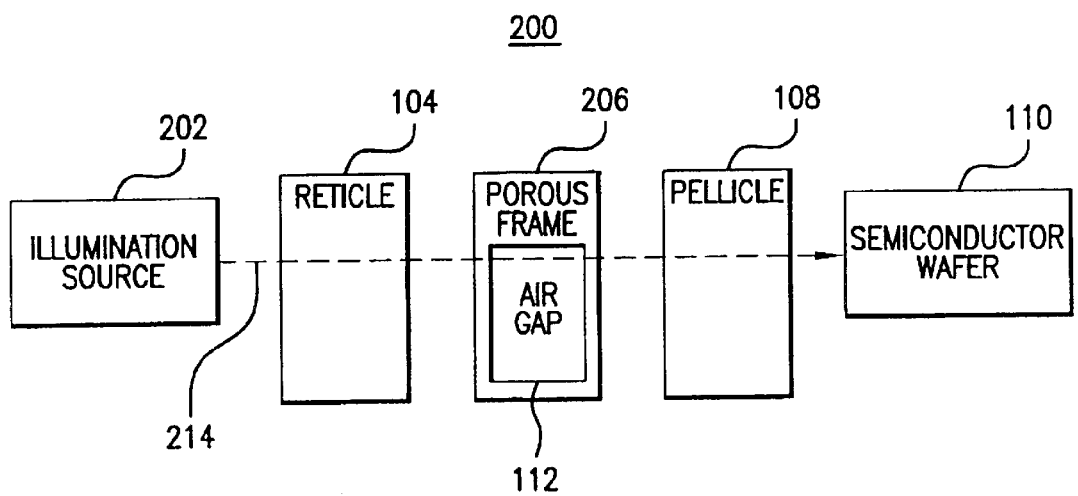
FIG. 2 illustrates a block diagram of the relevant portion of the optical path of a lithography system of the current invention.

FIG. 2 illustrates an exemplary photolithography system 200, according to an embodiment of the present invention. Photolithography system 200 is located in an ambient air environment. Photolithography system 200 maintains a purge gas environment between a reticle and a pellicle for transmission of light wavelengths that are sensitive to oxygen.

Photolithography system 200 comprises an illumination source 202, a reticle 104, a porous frame 206, a pellicle 108, and a semiconductor wafer 110.

Illumination source 202 includes a source of radiation for exposing a surface of semiconductor wafer 110. Illumination source 202 may include any applicable source of radiation suitable for exposing a semiconductor wafer surface, including a laser. Illumination source 202 transmits radiation 214. Radiation 214 may include any type of suitable radiation, including laser light. Radiation 214 may include oxygen-sensitive light wavelengths suitable for exposing and etching a semiconductor wafer. Such light wavelengths may include 157 nm wavelength light, for example.

Reticle 108 receives radiation 214. Reticle 104 includes a mask with a pattern that is transferred to a surface of semiconductor wafer 110 by radiation 214 from illumination source 202.

Porous frame 206 receives radiation 214 that has passed through reticle 108. Reticle 108 is attached to porous frame 206. Porous frame 206 comprises a porous material that allows gas to flow through, but blocks passage of particle contaminants.

Pellicle 108 receives radiation 214 that has passed through porous frame 206. Pellicle 108 is attached to porous frame 206. Reticle 104 is in optical alignment with pellicle 108.

Radiation 214 is transmitted through reticle 104, porous frame 206, purge air gap 112, and pellicle 108 to semiconductor wafer 110. Semiconductor wafer 110 receives radiation 214. Semiconductor wafer 110 comprises a surface to be exposed and etched with a pattern of reticle 104 by radiation 214 transmitted by illumination source 202.

Porous frame 206 encloses air gap 112. Air gap 112 is formed within porous frame 206 between reticle 104 and pellicle 108. Air gap 112 may be filled with a purge gas, such as nitrogen, that does not contain oxygen, and hence does not interfere with oxygen-sensitive wavelengths of radiation 214. Porous frame 206 further prevents particulate contamination from entering air gap 112 and damaging reticle 104. Porous frame 206 has sufficient porosity to allow gas to pass from air gap 112 enclosed by porous frame 206 to an exterior of porous frame 206.

Because porous frame 206 allows gas to flow in and out, in a static mode, porous frame 206 normalizes pressure within air gap 112 with atmospheric pressure, eliminating distortion to reticle 104 and/or pellicle 108.

Lithography system 200 provides a purge gas optical path for radiation 214 from illumination source 202. Hence, illumination source 202 may transmit oxygen-sensitive light wavelengths, without suffering from significant attenuation caused by oxygen absorption.

The reticle with purged pellicle-to-reticle gap of the present invention is described above in an example photolithography environment. The present invention is not limited to such an environment, and is applicable to additional photolithography environments, and non-photolithography environments. The example is presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the present invention.

Exemplary embodiments for a reticle with purged pellicle-to-reticle gap according to the present invention are described below. These embodiments are described herein for illustrative purposes, and are not limiting. The present invention is adaptable to any application requiring a reticle with purged pellicle-to-reticle gap.

Figure 3:
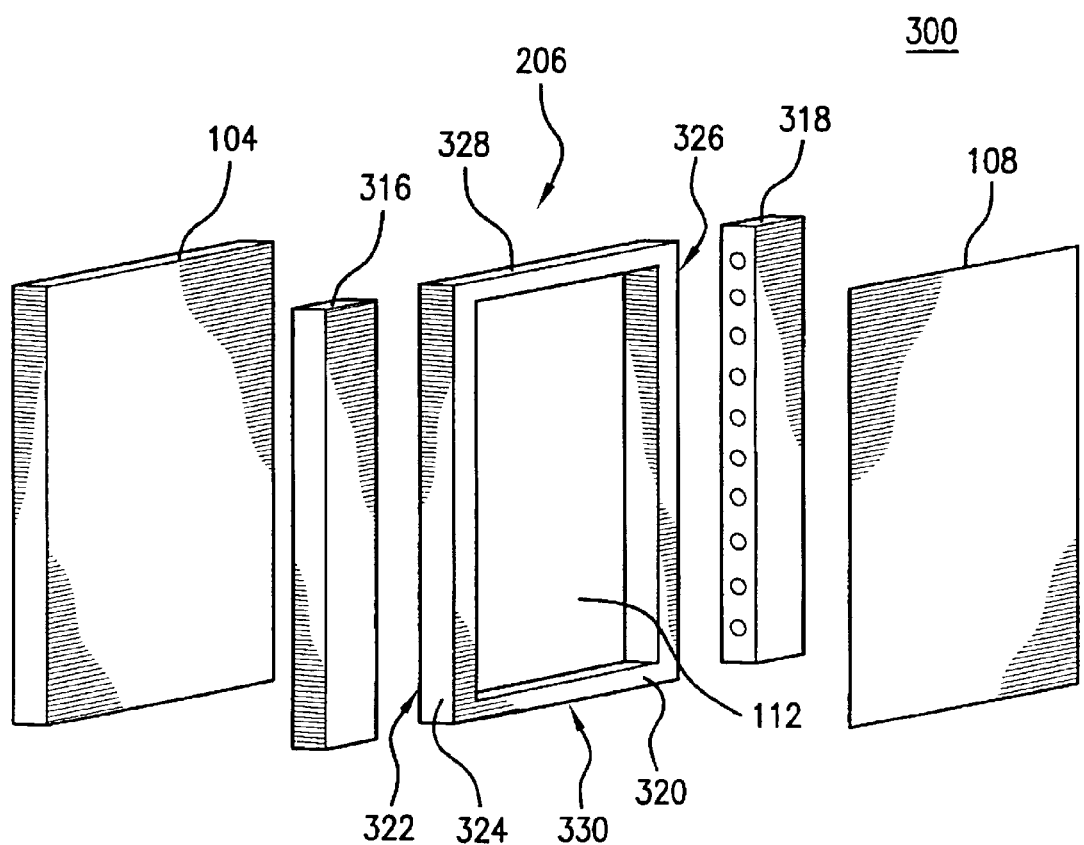
FIG. 3 illustrates an exploded view of a reticle and pellicle assembly with porous frame, according to an embodiment of the present invention.

FIG. 3 illustrates an exploded view of an exemplary purged pellicle-to-reticle gap system 300, according to an embodiment of the present invention. Purged pellicle-to-reticle gap system 300 comprises a reticle 104, a porous frame 206, a pellicle 108, an air gap 112, a purge gas supply interface 316, and a vacuum source interface 318.

Porous frame 206 comprises a first open surface 320 and a second open surface 322 (located on opposite side of porous frame 206 from first open surface 320, not visible in FIG. 3). First open surface 320 and second open surface 322 are substantially parallel to one another. Porous frame 206 is comprised of a porous filtering material. The porous filtering material of porous frame 206 allows the transmission of gases, but prevents the transmission of particles. These particles may include particles in the air, dust, particles resulting from the photolithography process, and particles resulting from other sources. In a preferred embodiment, porous frame 206 is substantially rectangular. In alternate embodiments, porous frame 206 may comprise other shapes, such as circular, elliptical, and irregular.

In a preferred embodiment, porous frame 206 is manufactured from one or more metals. For example, porous frame 206 may comprise iron, copper, bronze, nickel, titanium, or other metal, or any combination or alloy thereof Porous frame 206 comprises pores formed in the metal(s) by a pore forming process. For example, porous frame 206 may be made from metal powder particles or filaments bonded at their contact points by sintering, which may create a continuous, well-defined network of pores between the particles or filaments. Sintering techniques generally weld together and grow a contact area between two or more initially distinct particles at temperatures below the melting point. Other processes for forming pores are also within the scope of the present invention. The porosity, or pore size, may be controlled by the production process, and may be determined on an application-by-application basis. For example, the porosity may be specified in microns, or in fractions of a micron. The invention, however, is not limited to these porosity values. A number of vendors can potentially supply suitable porous metals that are manufactured according to sintering and other techniques. Such vendors may include GKN Sinter Metals, in Auburn Hills, Mich., and Capstan Permaflow, Inc., in Gardena, Calif.

Pellicle 108 is coupled to first open surface 320 of porous frame 206. Pellicle 108 may comprise a glass, a membrane, or other material, as would be known to persons skilled in the relevant art(s). Pellicle 108 is attached or affixed to first open surface 320 such that air gap 112 is completely enclosed at first open surface 320. Furthermore, pellicle 108 is attached to first open surface 320 such that a substantially air tight seal is formed at the interface of pellicle 108 and first open surface 320. Pellicle 108 and first open surface 320 are attached in a manner well known to persons skilled in the relevant art(s). For example, pellicle 108 may be glued to first open surface 320.

Reticle 104 is coupled to second open surface 322 of porous frame 206. Reticle 104 is attached or affixed to second open surface 322 such that air gap 112 is completely enclosed at second open surface 322. Furthermore, reticle 104 is attached to second open surface 322 such that a substantially air tight seal is formed at the interface of reticle 104 and second open surface 322. Reticle 104 and second open surface 322 are attached in a manner well known to persons skilled in the relevant art(s).

Pellicle 108, reticle 104, and porous frame 206 combine to form a substantially air tight air gap 112, where gases flow only through the material of porous frame 206. In a preferred embodiment, the porous filtering material of porous frame 206 is capable of allowing transmission of a gas while simultaneously blocking the entrance of particulate contamination.

The "breathable" porous frame 206 assembly with reticle 104 and pellicle 108 may either be allowed to remain static (i.e. open to the surrounding environment), or be coupled to an external pressurized purge gas source as described above. Purge gas supply interface 316 interfaces porous frame 206 with a purge gas supply. Purge gas supply interface 316 connects to a first frame end surface 324 of porous frame 206. Purge gas supply interface 316 preferably provides a purge gas from a purge gas supply to first frame end surface 324. The purge gas infuses from purge gas supply interface 316 into air gap 112 through the pores of first frame end surface 324. In an alternative embodiment, purge gas supply interface 316 is a first port, hole, or valve in porous frame 206 for providing purge gas through porous frame 206 and into air gap 112.

Vacuum source interface 318 interfaces porous frame 206 with a vacuum source. Vacuum source interface 318 connects to a second frame end surface 326 of porous frame 206. As shown in FIG. 3, second frame end surface 326 is located on the opposite side of porous frame 206 from first frame end surface 324 (not visible in FIG. 3). In alternate embodiments, second frame end surface 326 maybe located on sides of porous frame 206 that are not opposite first frame end surface 324. Vacuum source interface 318 preferably evacuates or removes the purge gas from air gap 112 through the pores of second frame end surface 326. In an alternative embodiment, vacuum source interface 318 is a second port, hole, or valve in porous frame 206 for evacuating or removing purge gas more directly from air gap 112.

In normal operation, porous frame 206 has four exposed outer surfaces: first frame end surface 324, second frame end surface 326, a third frame end surface 328, and a fourth frame end surface 330 (opposite of third frame end surface 328, not visible in FIG. 3). In a preferred embodiment, all exposed outer surfaces of porous frame 206 are porous, and allow gas to pass into and out from air gap 112. In alternative embodiments, first frame end surface 324 and second frame end surface 326 are the only exposed outer surfaces of porous frame 206 that are porous. This is especially useful in dynamic uses of the present invention, allowing porous frame 206 to be coupled to a purge gas source and vacuum source at first frame end surface 324 and second frame end surface 326, respectively, with no remaining exposed surfaces to leak gas.

Purge gas may enter the assembly via purge gas supply interface 316, and be evacuated from the assembly via vacuum source interface 318 to create a continuous flow of purge gas through air gap 112. The purge gas flow through air gap 112 is balanced to be equal to atmospheric pressure, to eliminate distortion to reticle 104 and/or pellicle 108.

Exemplary embodiments of a reticle with purged pellicle-to-reticle gap of the present invention are described above. The present invention is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the present invention.

Exemplary operational and/or structural implementations related to the structure(s), and/or embodiments described above are presented in this section. These components and methods are presented herein for purposes of illustration, and not limitation. The invention is not limited to the particular examples of components and methods described herein. Alternatives (including equivalents, extensions, variations, deviations, etc., of those described herein) will be apparent to persons skilled in the relevant art(s) based on the teachings contained herein. Such alternatives fall within the scope and spirit of the present invention.

Figure 4:
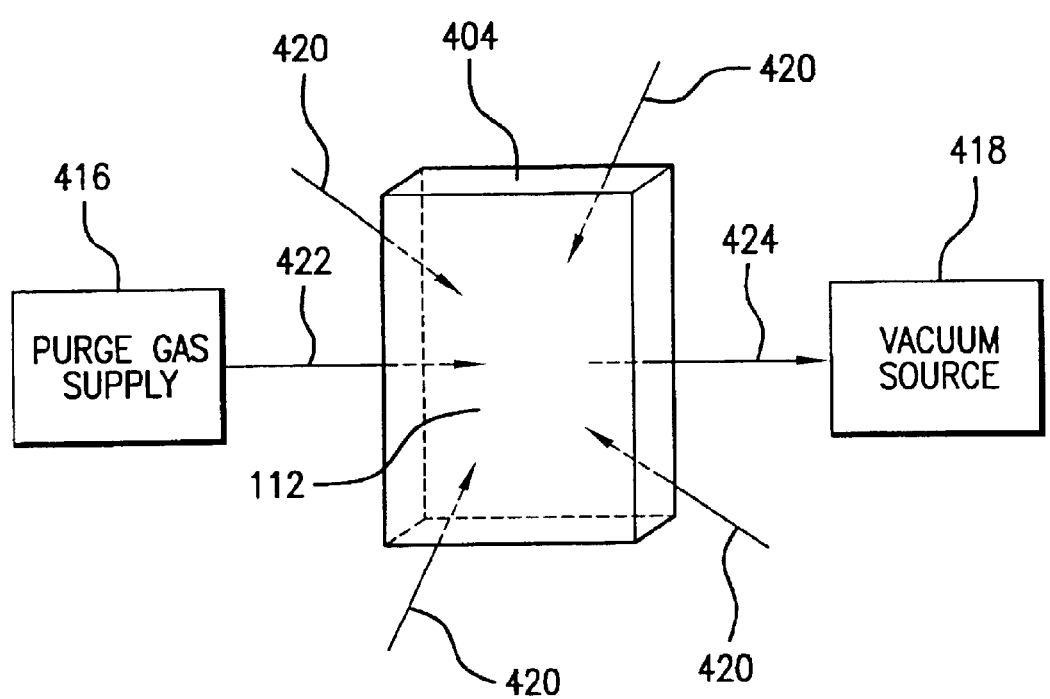
FIG. 4 illustrates operation of an exemplary embodiment of the present invention.

FIG. 4 illustrates operation of an exemplary embodiment of the present invention. FIG. 4 shows a porous frame reticle/pellicle assembly 404, a purge gas supply 416, and a vacuum source 418.

In a preferred embodiment, porous frame reticle/pellicle assembly 400 comprises a reticle, a porous frame, and a pellicle, such as reticle 104, porous frame 206, and pellicle 108 shown in FIG. 3. Porous reticle/pellicle assembly 400 further comprises an air gap 112.

In a preferred embodiment, porous frame reticle/pellicle assembly 404 maintains mechanical particulate control on a critical surface of the reticle, while allowing a continuous purge gas or air environment flow in air gap 112. Furthermore, porous reticle/pellicle assembly 400 normalizes the pressure within air gap 112, effectively eliminating distortion of either the reticle or pellicle due to atmospheric pressure changes.

In embodiments, the porous filtering material of porous frame 206 is capable of allowing transmission of a gas while simultaneously blocking the entrance of particulate contamination. This "breathable" porous frame reticle/pellicle assembly 400 may be allowed to remain static (i.e. open to the surrounding environment). In a static embodiment, porous frame reticle/pellicle assembly 400 is not coupled to a purge gas supply 416 or a vacuum source 418. Ambient air may be allowed to enter air gap 112 through porous frame reticle/pellicle assembly 400, as in example ambient air flow paths 420. However, in a preferred embodiment described below, a continuous flow of purge gas is injected into air gap 112 to prevent ambient air from entering air gap 112.

Porous frame reticle/pellicle assembly 400 may also operate in a dynamic environment. In a dynamic embodiment, porous frame reticle/pellicle assembly 400 maybe coupled to a purge gas supply 416. Purge gas supply 416 supplies a purge gas through a porous frame of porous frame reticle/pellicle assembly 400 to air gap 112. The purge gas entering air gap 112 is shown as inserted purge gas flow 422. Suitable gas supply systems for purge gas supply 416 are well known in the art.

Furthermore in a dynamic embodiment, porous frame reticle/pellicle assembly 400 may be coupled to a vacuum source 418. Vacuum source 418 removes purge gas and/or ambient environment gas (if present) from air gap 112 through aporous frame of porous frame reticle/pellicle assembly 400. Purge gas being removed from air gap 112 is shown as removed gas flow 424. Suitable vacuum systems for use as vacuum source 418 are well known in the art.

Flowcharts are provided that detail operational steps of an example embodiment of the present invention. The steps provided do not necessarily have to occur in the order shown, as will be apparent to persons skilled in the relevant art(s) based on the teachings herein. Other structural and operational embodiments will be apparent to persons skilled in the relevant art(s) based on the discussion contained herein. These steps are described in detail below.

Figure 5:
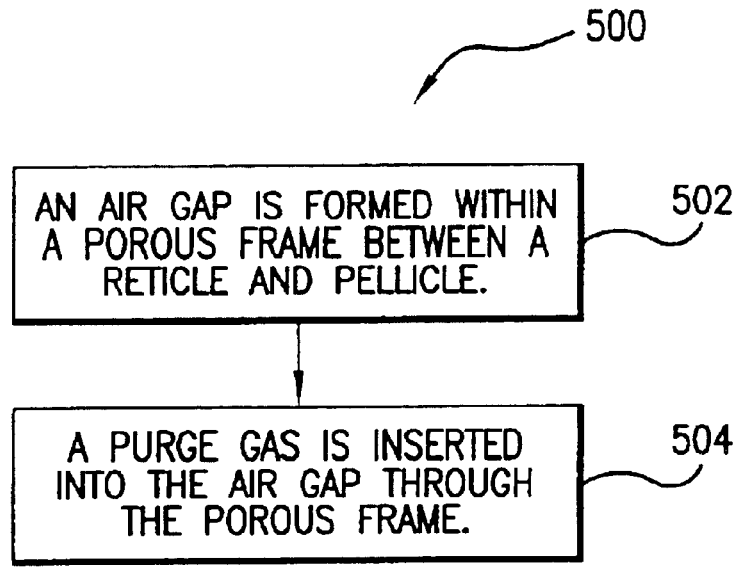
FIGS. 5 and 6 illustrate flowcharts providing operational steps for embodiments of the present invention.

FIG. 5 illustrates a flowchart providing operational steps for an embodiment of the present invention. A process 500 shown in FIG. 5 begins with step 502. In step 502, an air gap is formed within a porous frame between a reticle and pellicle. In step 504, a purge gas is inserted into the air gap through the porous frame.

Figure 6:
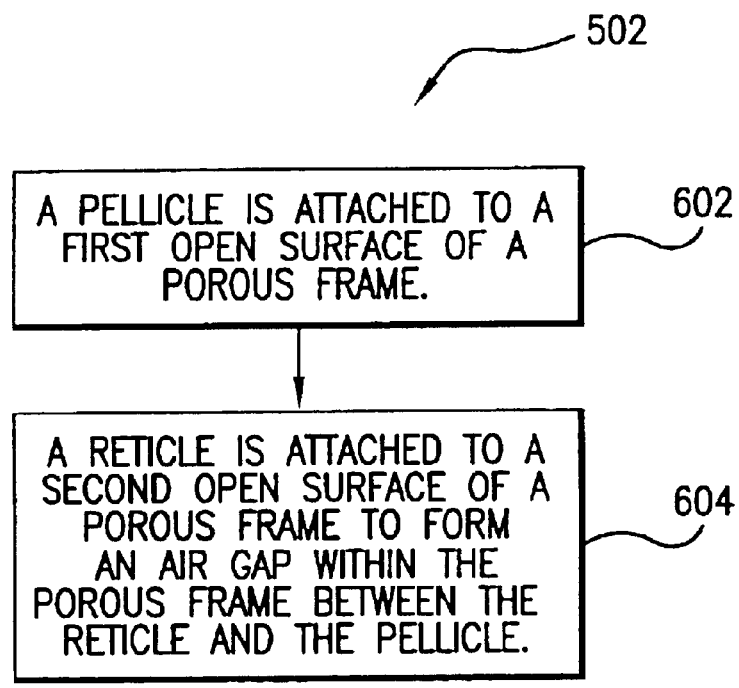

FIG. 6 illustrates a flowchart providing exemplary detailed operational steps for step 502 of FIG. 5. In step 602, a pellicle is attached to a first open surface of a porous frame. In step 604, a reticle is attached to a second open surface of a porous frame to form an air gap within the porous frame between the reticle and the pellicle.

Process 500 of FIG. 5 may further include a step where the inserted purge gas is filtered by the porous frame.

Step 504 may include a step where a purge gas is inserted into the air gap through an end surface of the porous frame.

Process 500 may further include a step where the purge gas is removed from the air gap. This step may include a step where the purge gas is removed from the air gap through a frame end surface of the porous frame.

Process 500 may further include a step where a purge gas pressure in the air gap is balanced with an ambient environment air pressure.

In an alternative embodiment, a purge gas pressure in air gap 112 is maintained to exceed an ambient environment air pressure. By allowing the purge gas pressure in air gap 112 to exceed the ambient environment air pressure, a substantially oxygen-purged air gap 112 may be maintained. A purge gas supply 416 inserts a purge gas into air gap 112. The purge gas is inserted at a rate such that the purge gas pressure in air gap 112 exceeds the ambient environment air pressure, and hence, the purge gas will leak out of air gap 112 through porous frame 206. The purge gas is inserted at a rate slowly enough so as not to cause substantial distortion to reticle 104 and/or pellicle 208. The purge gas leaking out of air gap 112 through porous frame 206 substantially impedes the ability of ambient air to leak into air gap 112 through porous frame 206. In this alternative embodiment, a vacuum source 419 is not needed to remove the purge gas, because the purge gas leaks out of air gap 112 through porous frame 206.

Additional steps or enhancements to the above processes and steps which may become known to persons skilled in the relevant art(s) from the teachings herein are also encompassed by the present invention.

Porous Material Insert Embodiments

In alternative embodiments of the present invention, the porous frame is not entirely made of the porous filtering material. For example, in an embodiment, one or more sections of the frame are made of the porous filtering material, while the remainder of the frame is made of a solid, non-porous material. Furthermore, in another embodiment, the frame is made from a solid material that has one or more opening in which porous material is positioned. Such embodiments are further described in this section.

Figure 7A:
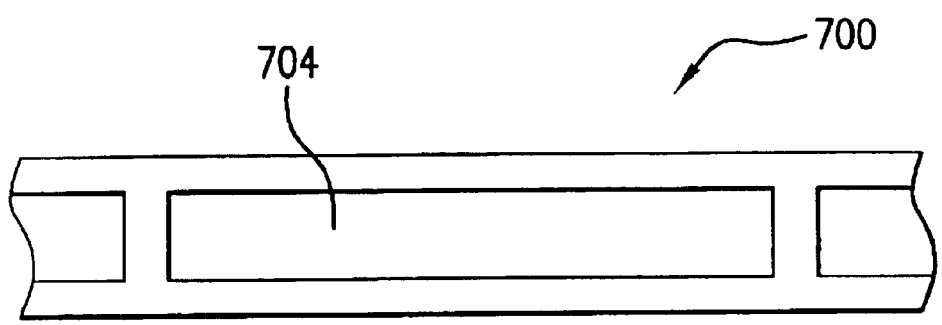
FIG. 7A shows a portion of an edge of an example frame having an opening therein, according to an embodiment of the present invention.
Figure 7B:
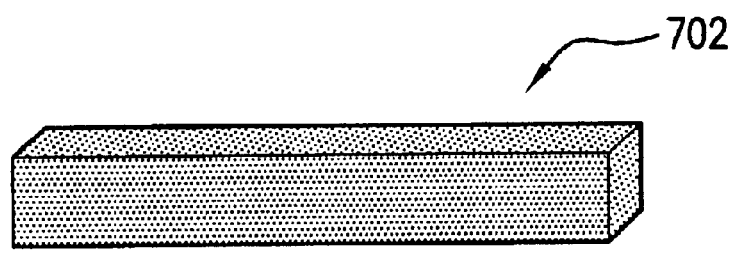
FIG. 7B shows an example porous material insert that is adapted for being positioned in the edge opening of the frame shown in FIG. 7A, according to an embodiment of the present invention.
Figure 7C:
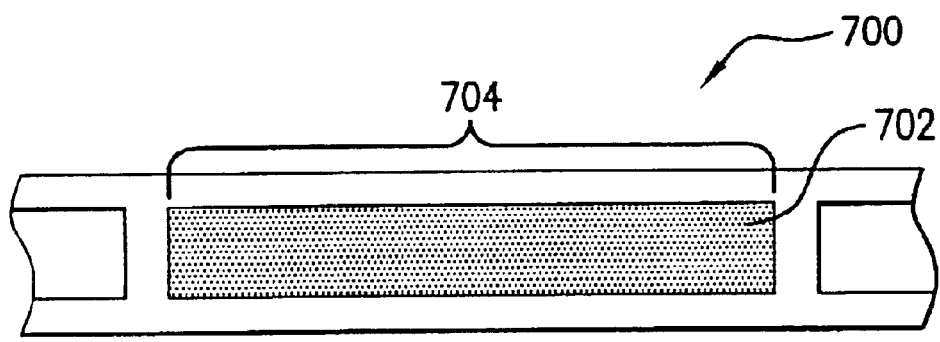
FIG. 7C shows the frame of FIG. 7A with the porous material insert of FIG. 7B positioned in the edge opening therein, according to an embodiment of the present invention.

For example, FIG. 7A shows a portion of an edge of an example frame 700 having an opening 704 therein, in which porous material is to be positioned. FIG. 7B shows an example porous material insert 702 that is adapted for being positioned in opening 704 of frame 700. FIG. 7C shows frame 700 with porous material insert 702 positioned therein.

Frame 700 with one or more porous material inserts 702 has numerous advantages. For instance, frame 700 can be made from numerous rigid materials, including a metal such as iron, copper, nickel, bronze, titanium, other metal, or combination/alloy thereof. For example, frame 700 can be formed from iron-nickel alloys such as Invar or other low coefficient of thermal expansion (CTE) materials. Hence, a frame 700 with porous material inserts 702 is more structurally rigid or solid than is a completely porous frame. Furthermore, frame 700 has the functionality of the completely porous frames described above.

Any type of porous filtering material can be used for porous material inserts 702, including iron, copper, bronze, nickel, titanium, or other metal, or any combination or alloy thereof. Porous material inserts 702 can be made in a similar fashion as porous frame 206, as described above, for example. As described above for porous frame 206, porous material inserts 702 have pores formed in their base metal(s) by a pore forming process. For example, porous material inserts 702 can be formed by sintering to create pores therein. Porous material inserts formed in such a fashion may be referred to as "porous sintered material inserts," for example. By way of example, but not limitation, porous material inserts 702 can be formed from sintered Invar. Other materials and processes for forming porous material inserts 702 are also within the scope of the present invention.

Openings 704 allow gas to pass or flow between the gap inside of frame 700, reticle 104, and pellicle 108, and the exterior atmosphere. Porous material inserts 702 filter the gas, as described above for porous frame 206. Openings 704 can be formed in any shape through an edge of frame 700. For example, as shown in FIG. 7, opening 702 is substantially rectangular. Alternatively, opening 702 can be formed in a round or elliptical shape, or any other shape. Porous material insert 702 is correspondingly formed in the same shape, so that it can be positioned therein.

Porous material insert 702 can be inserted and positioned in opening 704 in a variety of ways, including bonding, pressing, clamping, etc. Porous material insert 702 can be secured in opening 704 by numerous securing or attachment means, including an adhesive material, such as a glue or epoxy, by one or more bolts, nails, and/or screws, and/or the like, or merely by a clamping pressure of frame 700.

Figure 8A:
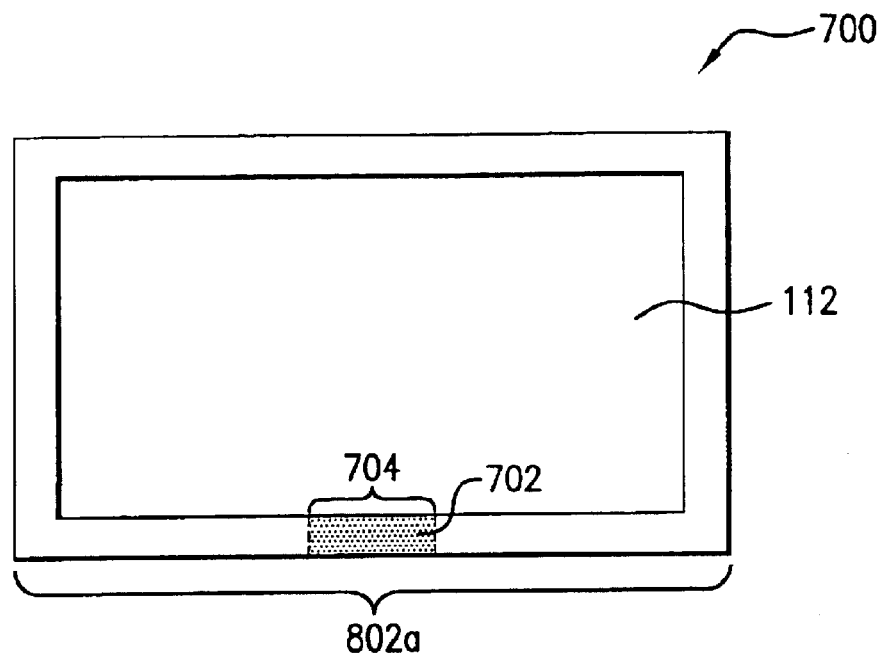

Any number of one or more porous material inserts 702 can be located in any number of the edges of frame 700. FIGS. 8A-8D each show an example frame 700, having one or more porous material inserts 702 positioned therein, according to example embodiments of the present invention. FIG. 8A shows frame 700 having a single porous material insert 702 located in a first edge 802a. As described above, porous material insert 702 allows for gas passage between gap 112 and the exterior of frame 700.

Figure 8B:
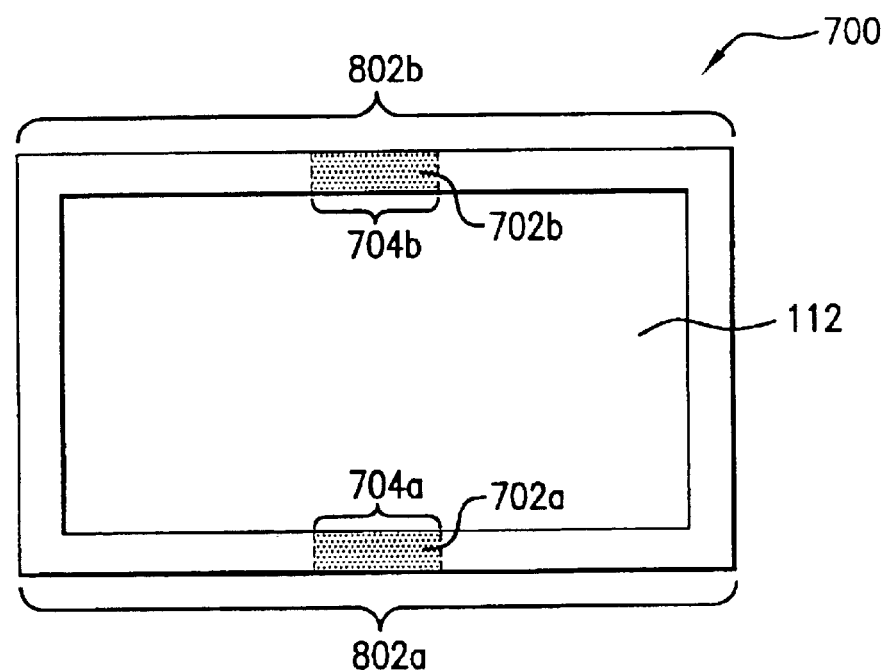

FIG. 8B shows frame 700 having a first porous material insert 702a located in an opening 704a in a first edge 802a, and a second porous material insert 702b located in an opening 704b in a second edge 802b. Such an embodiment is particularly applicable to use with a gas supply and vacuum source, such as purge gas supply 416 and vacuum source 418 shown in FIG. 4. For example, purge gas supply 416 can be configured to interface with opening 704a, and vacuum source 418 can be configured to interface with opening 704b. Any applicable interface means, including valves, tubes, clamps, seals, and other interface components otherwise known, or described elsewhere herein, can be used to create the interface(s). First and second porous material inserts 702a and 702b respectively filter the gas entering and exiting gap 112.

Figure 8C:
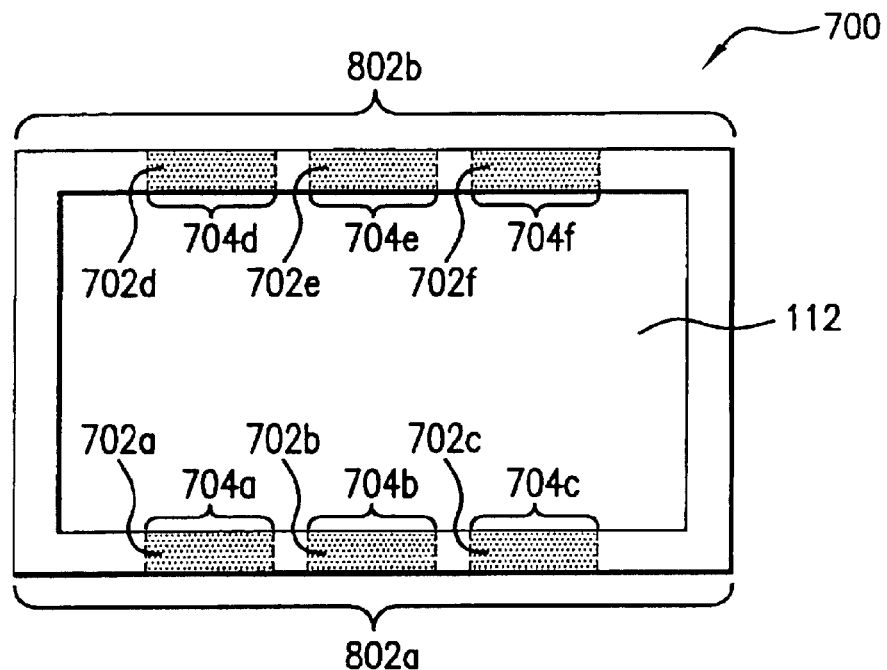

FIG. 8C shows a frame 700 having first, second, and third porous material inserts 702a–c positioned in respective openings 704a–c in first edge 802a of frame 700, and fourth, fifth, and sixth porous material inserts 702d–f positioned in respective openings 704d–f in second edge 802b of frame 700. In an embodiment, a gas supply can interface with openings 704a–c, while a vacuum source can interface with openings 704d–f.

Figure 8D:
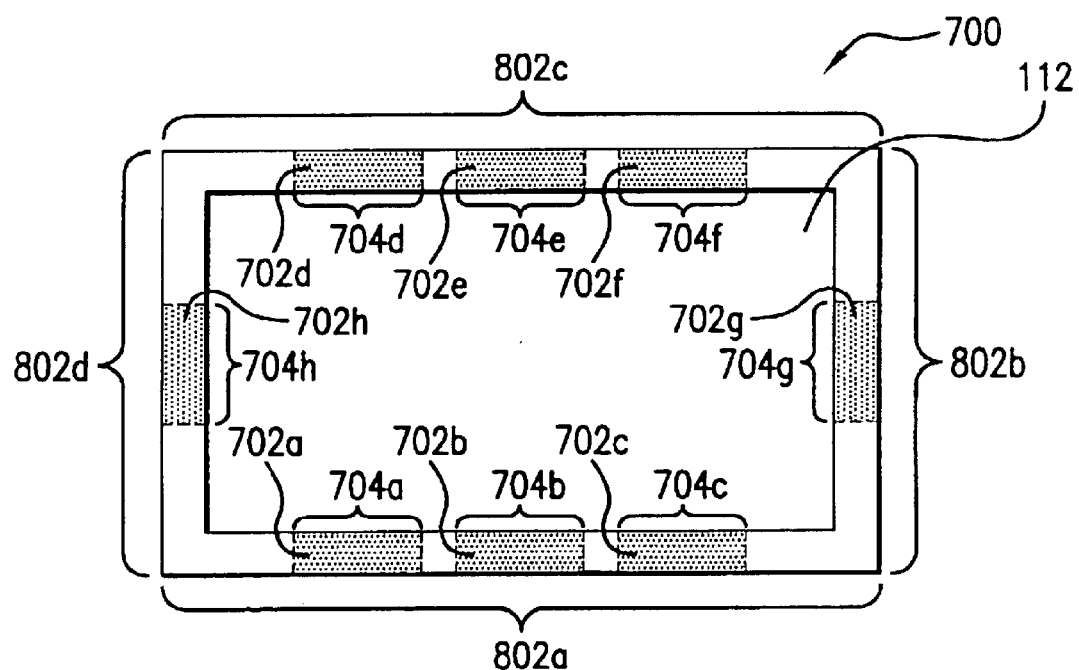

A frame 700 can have porous material inserts 702 positioned in any number of edges 802. For example, FIG. 8D shows a frame 700 having first, second, and third porous material inserts 702a–c positioned in respective openings 704a–c in first edge 802a of frame 700, fourth, fifth, and sixth porous material inserts 702d–f positioned in respective openings 704d–f in third edge 802c of frame 700, a seventh porous material insert 702g positioned in an opening 704g in a second edge 802b of frame 700, and an eighth porous material insert 702h positioned in an opening 704h in a fourth edge 802d of frame 700.

Note that alternatively, a single opening 704, and a respective porous material insert 702, can substantially span the entire length of an edge 802 of frame 700. Furthermore, in an embodiment, multiple porous material inserts 702 can be positioned in a single opening 704.

Figure 9A:
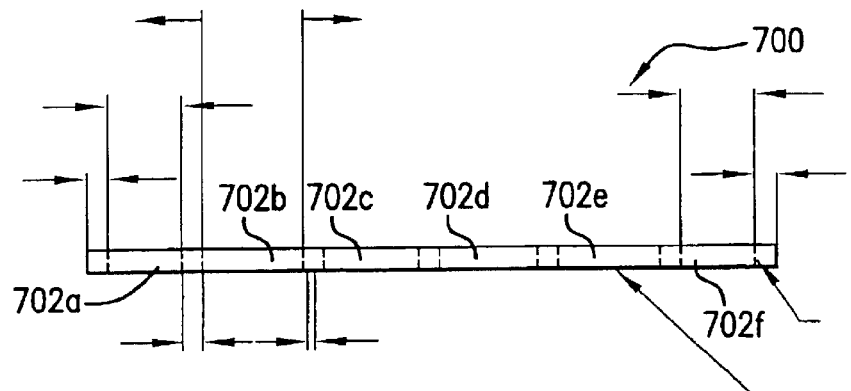
Figure 9B:
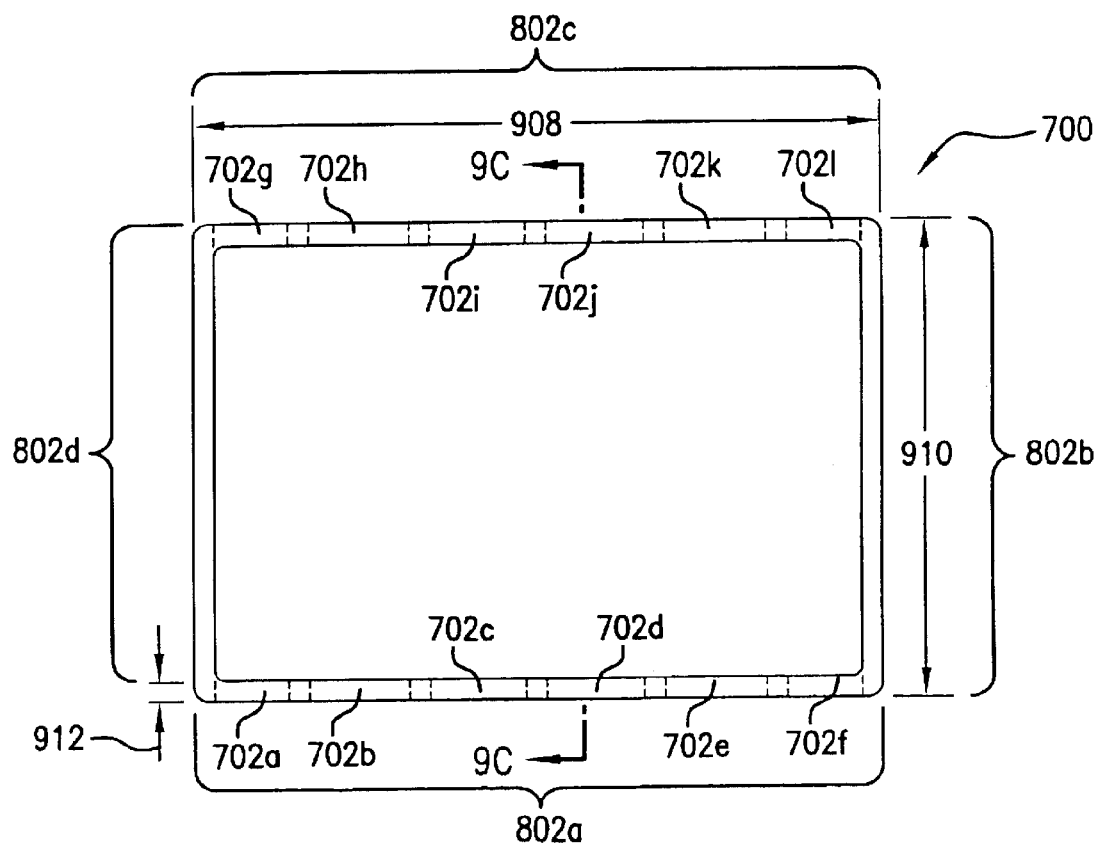

FIGS. 9A-9D show various views of another example frame 700 with porous material inserts 702, according to an embodiment of the present invention. FIG. 9A shows an edge-on view of frame 700, FIG. 9B shows a side view of frame 700, FIG. 9C shows a cross-sectional view of frame 700, and FIG. 9D shows a close-up cross-sectional view of edge 802a of frame 700.

As shown in FIG. 9B, first edge 802a has porous material inserts 702a–f positioned in respective openings therethrough. Third edge 802c has porous material inserts 702g–l positioned in respective openings therethrough. Second and fourth edges 802b and 802d do not have openings 704 formed therein.

As shown in FIG. 9D, porous material insert 702d substantially fills opening 704. Porous material insert 702d does not completely fill opening 704, which has a depth 906, but substantially fills opening 704, as it seals opening 704 so that gas passing through opening 704 is filtered by porous material insert 702d. In embodiments, a porous material insert 702 can fill an opening 704 to depth 906, to a lesser amount than depth 906, or to a greater amount than depth 906 such that porous material insert 702d extends out of opening 704.

Frame Embodiments Using Heightened Spacers to Mount Optical Structures

In a further alternative embodiment of the present invention, heightened "spacers," "tabs," "spacing members," and other spacing structure types are used to mount the reticle and/or pellicle to a frame. Such spacing structures establish a separate kinematic plane for the reticle and/or pellicle (or other optical structure). This tends to reduce a distortion of the reticle or pellicle, as compared to configurations where the reticle or pellicle is directly bonded to the frame. A bonding agent can be used to bond and seal the spaces formed by the spacing structures between the frame and reticle and/or pellicle. However, actual mechanical contact between the frame and the reticle and/or pellicle is made only by the spacing structures. These embodiments of the present invention are further described in this section.

For example, FIG. 10 shows a side view of a frame 1002 between two optical structures, according to an example embodiment of the present invention. In the example of FIG. 10, the optical structures are each attached to frame 1002 via a plurality of spacing members 1010. The optical structures shown in FIG. 10 are reticle 104 and pellicle 108. Frame 1002 is used to maintain a substantially particulate-free air gap between reticle 104 and pellicle 108 through which light can pass (i.e., an "optical gap"), similarly to as described above for lithography system 200 with regard to FIG. 2. (Note that in alternative embodiments, frame 1002 can be positioned between optical structures other than reticle 104 and/or pellicle 108.)

As shown in FIG. 10, frame 1002 has opposing first and second surfaces 1032 and 1034. First surface 1032 has a first opening and second surface 1034 has a second opening (neither opening is shown in FIG. 10). Note that frame 1002 can be a porous frame similar to porous frame 206 described above, can be a frame with porous inserts similar to frame 700 described above, or can be a non-porous or other type frame described elsewhere herein, or otherwise known. In embodiments, frame 1002 can be made of one or more metals, glass, a polymer, a porous sintered material such as Invar, or other material described elsewhere herein or otherwise known, or any combination thereof.

According to the present invention, a plurality of spacing members 1010 are used to mount an optical structure to a frame. For example, as shown in FIG. 10, a first plurality of spacing members 1010 are spaced apart on first surface 1032 of frame 1002, shown as spacing members 1010a and 1010b. A second plurality of spacing members 1010 are spaced apart on second surface 1034, shown as spacing members 1010c and 1010d. As shown in FIG. 10, spacing members 1010a and 1010b collectively establish a separate kinematic plane for pellicle 108, while spacing members 1010c and 1010d collectively establish a separate kinematic plane for reticle 104. Spacing members 1010a and 1010b have substantially flat and co-planar surfaces configured to mate with a surface of pellicle 108, and spacing members 1010c and 1010d have substantially flat and co-planar surfaces configured to mate with a surface of reticle 104. In an embodiment, the surfaces of spacing members 1010a–d are lapped flat and co-planar to optical specifications to minimize distortion of reticle 104 and pellicle 108.

Note that spacing members 1010 can have any height as needed to provide separation between frame 1002 and reticle 104 and/or pellicle 108. The relative sizes of spacing members 1010, frame 1002, reticle 108, and pellicle 104 shown in FIG. 10 are provided for illustrative purposes. Appropriate sizes for these components would be known to persons skilled in the relevant art(s), depending on the particular application.

Note that in, an embodiment, spacing members 1010 can be formed integrally with frame 1002. Alternatively, spacing members 1010 can be formed separately from frame 1002, and can be subsequently attached to frame 1002 by an adhesive. Furthermore, spacing members 1010 can be made from a variety of materials. For example, spacing members 1010 can be made from one or more metals, a polymer, glass, another material, or any combination thereof. Spacing members 1010 can be made from the same material(s) as frame 1002, or a different material.

A bonding agent is used to bond reticle 104 and pellicle 108 to frame 1002. Furthermore, the bonding agent maintains the air gap within frame 1002 by sealing the space between frame 1002 and reticle 104, and by sealing the space between frame 1002 and pellicle 108. As shown in FIG. 10, a bonding agent 1020 seals a space between first surface 1032 and pellicle 108, and seals a space between second surface 1034 and reticle 104. Bonding agent 1020 can be any type of bonding agent or substance, including those conventionally used to bond reticles/pellicles to frames, including an epoxy or other type of adhesive described elsewhere herein or otherwise known. FIG. 12 illustrates a top view of a corner portion 1200 of frame 1002, showing additional detail of bonding agent 1020 sealing the space around first opening 1202 in frame 1002, between first surface 1032 and pellicle 108.

Note that in embodiments, one or both of reticle 104 and pellicle 108 can be attached to frame 1002 via spacing members 1010. For example, FIG. 11 shows a side view of frame 1002 located between reticle 104 and pellicle 108, according to an example embodiment of the present invention. In FIG. 11, only pellicle 108 is attached to frame 1002 via spacing members 1010a and 1010b, while reticle 104 is directly attached to frame 1002, in a conventional fashion.

Any number of spacing members 1010 can be used to mount an optical structure. For example, FIGS. 13-16 show example distributions of spacing members 1010 on a frame 1002, according to embodiments of the present invention. Note that spacing members 1010 can be distributed as shown in FIGS. 13-16 on either or both sides of frame 1002, depending on whether one or two optical structures are to be mounted.

Figure 13:
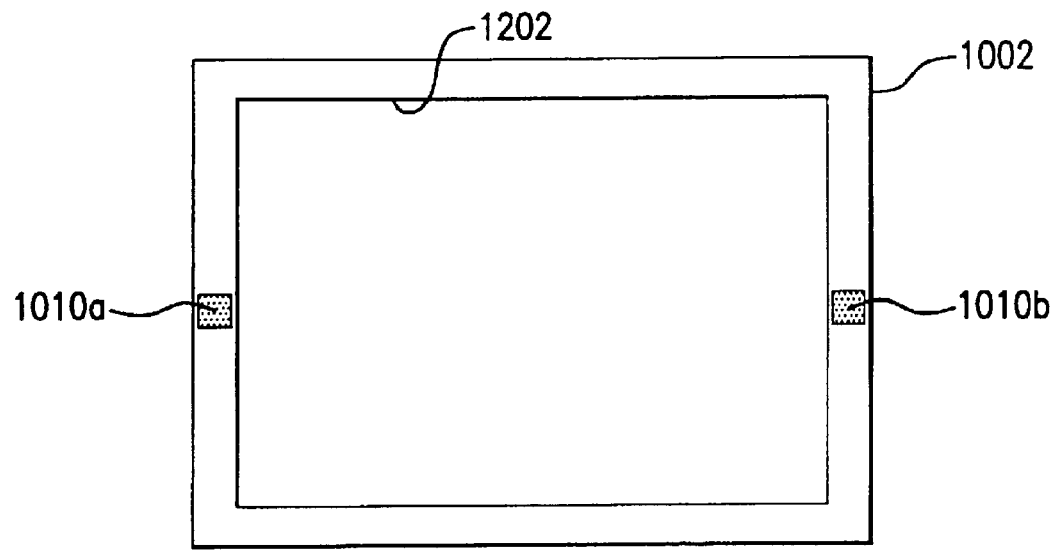

In a first example, FIG. 13 shows a plan view of frame 1002 having first and second spacing members 1010a and 1010b spaced apart on opposite sides of first opening 1202 in frame 1002.

Figure 14:
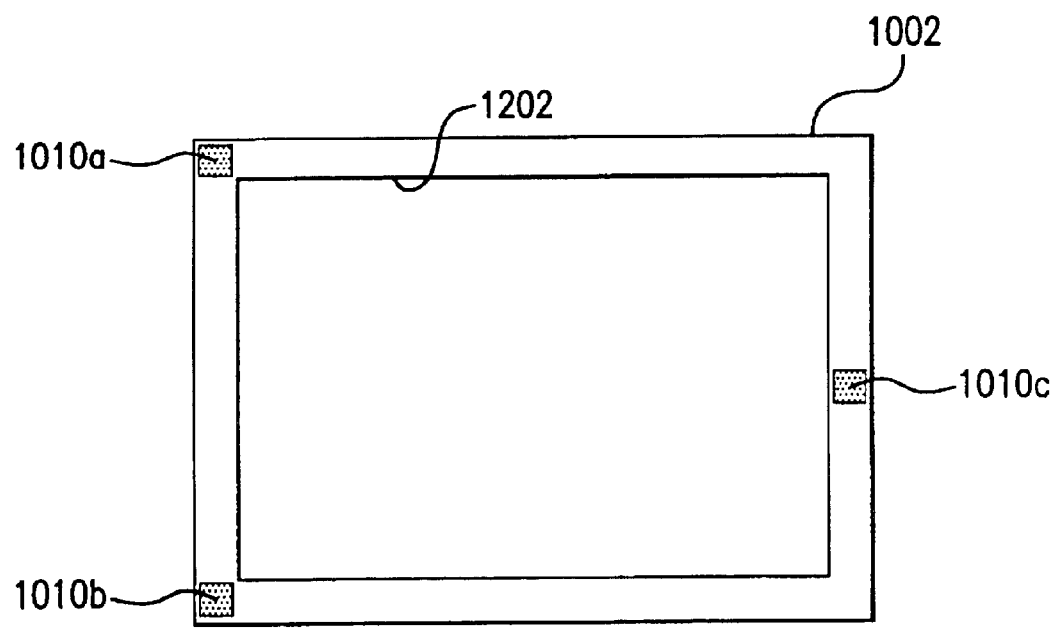

In another example, FIG. 14 shows a plan view of frame 1002 having first, second, and third spacing members 1010a–1010c spaced apart around first opening 1202 in frame 1002. First and second spacing members 1010a and 1010b are located in adjacent corners of frame 1002, while third spacing member 1010c is located in the center of the opposite side of frame 1002.

Figure 15:
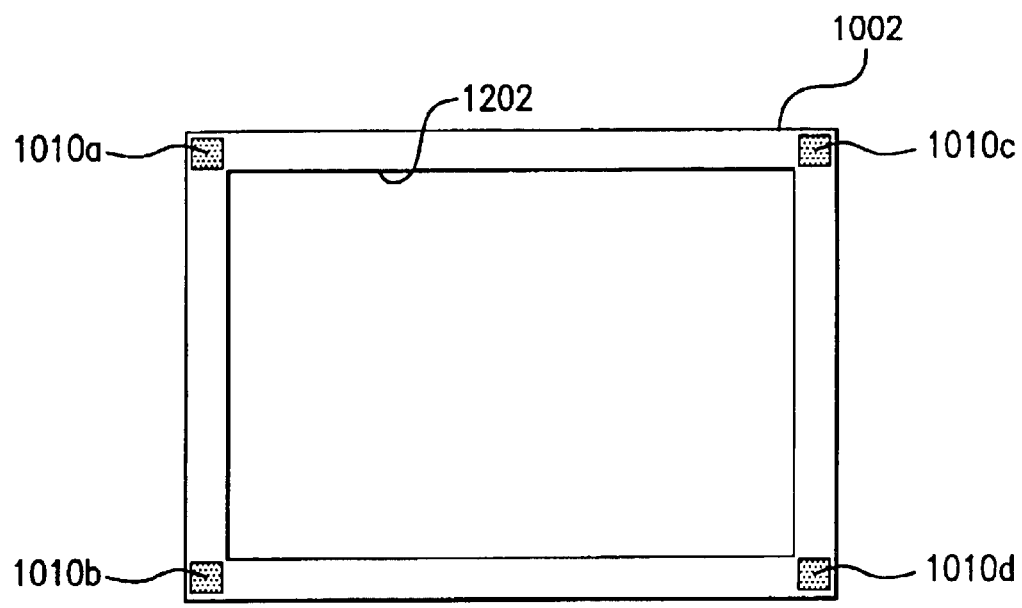

FIG. 15 shows a plan view of frame 1002 having first, second, third, and fourth spacing members 1010a–1010c spaced apart around first opening 1202, in the corners of frame 1002.

Figure 16:
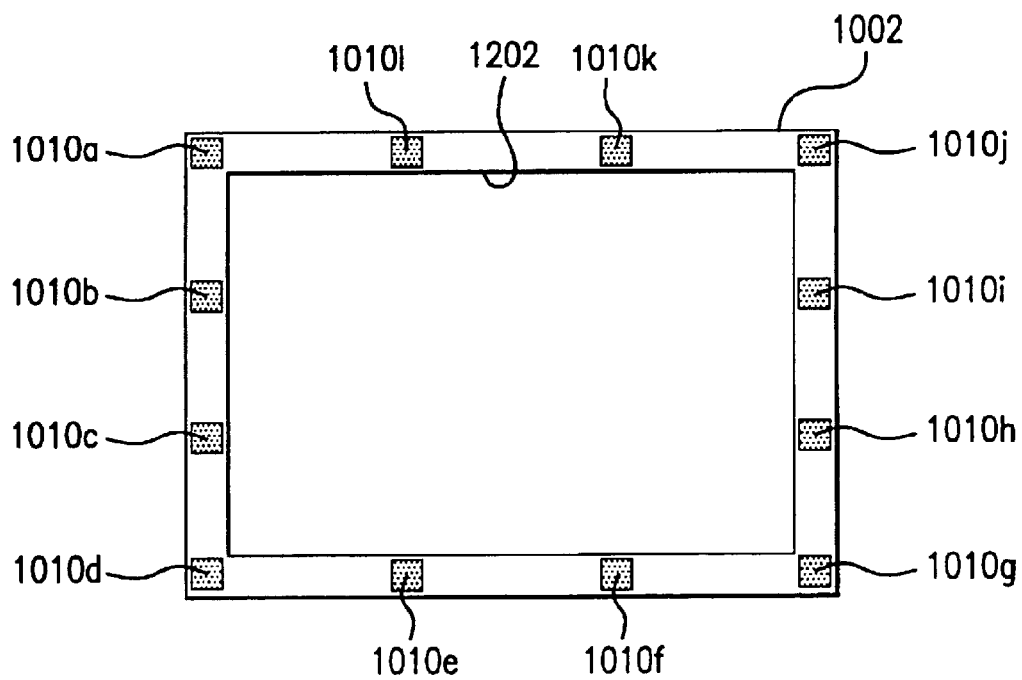

FIG. 16 shows a plan view of frame 1002 with spacing members 1010a–l spaced apart around first opening 1202 in frame 1002. Note that the embodiments of FIGS. 13-16 are shown for illustrative purposes. It would be understood to persons skilled in the relevant art(s) from the teachings herein that any number of spacing members 1010 can be used, and can be distributed around the openings of frame 1002 in any fashion.

Furthermore, for illustrative purposes, spacing members 1010 are shown in FIGS. 13-16 as being substantially square in shape. Spacing members 1010 can have other shapes, including round, rectangular, any other polygon, and irregular, for example.

In another embodiment of the present invention, spacers can be applied to frame 1002 via bonding agent 1020. For example, FIG. 17 shows a portion 1700 of frame 1002 with bonding agent 1020 applied thereto. In the embodiment of FIG. 17, bonding agent 1020 includes a spacer material, in the form of a plurality of spacers 1702, according to an embodiment of the present invention. The spacer material can be added to bonding agent 1020 prior to or after application of bonding agent 1020 to frame 1002.

FIG. 18 shows frame 1002 of FIG. 17, with pellicle 108 bonded thereto by bonding agent 1020. Once bonding agent 1020 hardens, spacers 1702 in bonding agent 1020 hold pellicle 108 at a substantially uniform distance from frame 1002, shown as distance 1802 in FIG. 18. Spacers 1702 operate to collectively establish a separate kinematic plane for pellicle 108, thereby reducing distortion of pellicle 108. Spacers 1702 can be made from a similar material to spacing members 1010, or a different material. Spacers 1702 can be manufactured to tight tolerances as needed to establish a uniform plane in order to reduce distortion of pellicle 108 (and/or reticle 104).

Although spacers 1702 are shown in FIGS. 17 and 18 as being substantially spherical or "bead"-shaped, spacers 1702 can alternatively be cube-shaped, rectangular-shaped, or other appropriate shape.

FIG. 19 shows a flowchart 1900 providing steps for forming an optical gap between optical structures in a photolithography system, according to embodiments of the present invention. Other structural and operational embodiments will be apparent to persons skilled in the relevant art(s) based on the following discussion. These steps are described in detail below.

Flowchart 1900 begins with step 1902. In step 1902, a frame is provided. For example, in an embodiment, the frame is frame 1002, as shown in FIG. 10, and further described above. As shown in FIG. 10, frame 1002 defines first and second opposing surfaces 1032 and 1034. First opposing surface 1032 defines a first opening 1202 (as shown in FIGS. 12-16) and second opposing surface 1034 defines a second opening (on far side of frame 1002, not explicitly shown in FIGS. 12-16).

In step 1904, a first optical structure is bonded to a spacer structure on the first opposing surface of the frame. The first optical structure can be any optical structure, including a reticle or pellicle. For example, FIG. 10 shows the first optical structure as pellicle 108. Pellicle 108 is bonded to a spacer structure on surface 1032 of frame 1002, shown as spacing members 1010a and 1010b in the example of FIG. 10. Note that in an alternative embodiment, the spacer structure can be a spacing material applied with bonding agent 1020, such as spacers 1702 shown in FIG. 17.

In step 1906, a second optical structure is bonded to a second spacer structure on the second opposing surface of the frame. The second optical structure can be any optical structure, including a reticle or pellicle. For example, FIG. 10 shows the second optical structure as reticle 104. Reticle 104 is bonded to a second spacer structure on surface 1034 of frame 1002, shown as spacing members 1010c and 1010d in the example of FIG. 10. Note that in an alternative embodiment, the second spacer structure can be a spacing material applied with bonding agent 1020, such as spacers 1702 shown in FIG. 17.

Note that step 1906 is optional, and in an embodiment, the second optical structure is bonded directly to the frame, without spacer structures present. An example of this is shown in FIG. 11, where reticle 104 is bonded directly to surface 1034 of frame 1002.

In this manner, the frame and optical structures of the present invention enclose the optical gap. Note that in embodiments, the optical gap can be filled with any gas, including a nitrogen-based gas that is purged of oxygen. The frame can comprise a porous filtering material that can aid in actively or passively filtering a gas entering and/or leaving the optical gap. Alternatively, the frame can be non-porous. In embodiments, the frame can include one or more gas valves for sourcing a gas to and from the optical gap. The embodiments described herein may be combined in any manner.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. An apparatus for maintaining an optical gap between optical structures in a photolithography system, comprising:
    a frame defining first and second opposing surfaces, said first opposing surface defining a first opening and said second opposing surface defining a second opening;
    a plurality of spacing members spaced apart on said first opposing surface around said first opening and having substantially co-planar surfaces configured to mate with a surface of a first optical structure; and
    a bonding agent that seals a space around said first opening between said first opposing surface and the first optical structure;
    wherein said frame encloses the optical gap between the first optical structure and a second optical structure.

2. The apparatus of claim 1, wherein said plurality of spacing members are formed integrally with said frame.

3. The apparatus of claim 1, wherein said plurality of spacing members are formed separately from said frame.

4. The apparatus of claim 1, wherein said first optical structure is a reticle; and
    wherein said second optical structure is a pellicle in optical alignment with said reticle.

5. The apparatus of claim 1, wherein said first optical structure is a pellicle; and
    wherein said second optical structure is a reticle in optical alignment with said pellicle.

6. The apparatus of claim 1, further comprising:
    a second plurality of spacing members spaced apart on said second opposing surface around said second opening and having substantially co-planar surfaces configured to mate with a surface of the second optical structure; and
    wherein said bonding agent seals a space around said second opening between said second opposing surface and the second optical structure.

7. The apparatus of claim 1, wherein said frame comprises a porous sintered material.

8. The apparatus of claim 1, wherein said porous sintered material is Invar.

9. The apparatus of claim 1, wherein said frame comprises at least one metal.

10. The apparatus of claim 1, wherein said frame comprises glass.

11. An apparatus for maintaining an optical gap between optical structures in a photolithography system, comprising:
    a frame defining first and second opposing surfaces, said first opposing surface defining a first opening and said second opposing surface defining a second opening;
    a bonding agent that seals a space around said first opening between said first opposing surface and a first optical structure, said bonding agent including a spacer material that maintains the first optical structure at a substantially uniform distance from said first opposing surface; and
    wherein said frame encloses the optical gap between the first optical structure and a second optical structure.

12. The apparatus of claim 11, wherein said first optical structure is a reticle; and
    wherein said second optical structure is a pellicle in optical alignment with said reticle.

13. The apparatus of claim 11, wherein said first optical structure is a pellicle; and
    wherein said second optical structure is a reticle in optical alignment with said pellicle.

14. The apparatus of claim 11, wherein said bonding agent seals a space around said second opening between said second opposing surface and the second optical structure, said spacer material of said bonding agent maintaining the second optical structure at a substantially uniform distance from said second opposing surface.

15. The apparatus of claim 11, wherein said frame comprises a porous sintered material.

16. The apparatus of claim 11, wherein said porous sintered material is Invar.

17. The apparatus of claim 11, wherein said frame comprises at least one metal.

18. The apparatus of claim 11, wherein said frame comprises glass.

19. The apparatus of claim 11, wherein said spacer material comprises a plurality of spherical-shaped spacers.

20. The apparatus of claim 11, wherein said spacer material comprises a plurality of cube-shaped spacers.

21. A photolithography system, comprising:
    an illumination source that transmits radiation, wherein said radiation includes at least one light wavelength;
    a reticle;
    a source optics that guides said radiation from said illumination source to said reticle;
    a frame defining first and second opposing surfaces, said first opposing surface defining a first opening and said second opposing surface defining a second opening;
    a plurality of spacing members spaced apart on said first opposing surface around said first opening and having substantially co-planar surfaces configured to mate with a surface of said reticle; and
    a bonding agent that seals a space around said first opening between said first opposing surface and said reticle;
    a pellicle coupled to said second opposing surface of said frame; and
    a projection optics;
    wherein said frame encloses an optical gap between said reticle and said pellicle;
    wherein at least a portion of said radiation passes through said reticle, said optical gap, and said pellicle; and
    wherein said projection optics guides said at least a portion of said radiation from said pellicle to a surface of a wafer.

22. The apparatus of claim 21, wherein said plurality of spacing members are formed integrally with said frame.

23. The apparatus of claim 21, wherein said plurality of spacing members are formed separately from said frame.

24. The apparatus of claim 21, further comprising:
- a second plurality of spacing members spaced apart on said second opposing surface around said second opening and having substantially co-planar surfaces configured to mate with a surface of said pellicle; and
- wherein said bonding agent seals a space around said second opening between said second opposing surface and said pellicle.

25. The apparatus of claim 24, wherein said second plurality of spacing members are formed integrally with said frame.

26. The apparatus of claim 24, wherein said second plurality of spacing members are formed separately from said frame.

27. A photolithography system, comprising:
- an illumination source that transmits radiation, wherein said radiation includes at least one light wavelength;
- a reticle;
- a source optics that guides said radiation from said illumination source to said reticle;
- a frame defining first and second opposing surfaces, said first opposing surface defining a first opening and said second opposing surface defining a second opening;
- a bonding agent that seals a space around said first opening between said first opposing surface and said reticle, said bonding agent including a spacer material that maintains the reticle at a substantially uniform distance from said first opposing surface;
- a pellicle coupled to said second opposing surface of said frame; and
- a projection optics;
- wherein said frame encloses an optical gap between said reticle and said pellicle;
- wherein at least a portion of said radiation passes through said reticle, said optical gap, and said pellicle; and
- wherein said projection optics guides said at least a portion of said radiation from said pellicle to a surface of a wafer.

28. The apparatus of claim 27, further comprising:
- wherein said bonding agent seals a space around said second opening between said second opposing surface and said pellicle, said spacer material of said bonding agent maintaining the pellicle at a substantially uniform distance from said second opposing surface.

29. The apparatus of claim 27, wherein said spacer material comprises a plurality of spherical-shaped spacers.

30. The apparatus of claim 27, wherein said spacer material comprises a plurality of cube-shaped spacers.

* * * * *